(12) United States Patent
Choi et al.

(10) Patent No.: US 8,824,225 B2
(45) Date of Patent: Sep. 2, 2014

(54) OUTPUT ENABLE SIGNAL GENERATION CIRCUIT

(71) Applicant: SK hynix Inc., Icheon-si (KR)

(72) Inventors: Hoon Choi, Icheon-si (KR); Jin Hee Cho, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/710,630

(22) Filed: Dec. 11, 2012

(65) Prior Publication Data
US 2013/0329507 A1 Dec. 12, 2013

(30) Foreign Application Priority Data
Jun. 8, 2012 (KR) .................. 10-2012-0061566

(51) Int. Cl.
*G11C 7/00* (2006.01)
*G11C 7/22* (2006.01)
*G11C 7/10* (2006.01)

(52) U.S. Cl.
CPC .............. *G11C 7/222* (2013.01); *G11C 7/1066* (2013.01)
USPC .................................. 365/194; 365/233.5

(58) Field of Classification Search
CPC .................................. G11C 7/222; G11C 7/22
USPC ................................. 365/194, 233.5
See application file for complete search history.

(56) References Cited

U.S. PATENT DOCUMENTS

| 8,030,981 B2 * | 10/2011 | Kim ............................ 327/284 |
| 2010/0008167 A1 * | 1/2010 | Shin ............................ 365/194 |
| 2010/0109726 A1 * | 5/2010 | Ahn et al. ....................... 327/158 |

FOREIGN PATENT DOCUMENTS

KR 100933800 B1 12/2009

* cited by examiner

*Primary Examiner* — Michael Tran
(74) *Attorney, Agent, or Firm* — William Park & Associates Ltd.

(57) ABSTRACT

An output enable signal generation circuit includes an output enable reset signal generation unit configured to enable an output enable reset signal in response to an external clock signal, a DLL locking signal, and a reset signal, an output enable reset signal delay unit configured to delay the output enable reset signal and output the delayed output enable reset signal, a counter unit configured to output the count of the external clock signal as a value in response to the output enable reset signal and the delayed output enable reset signal, a read command delay unit configured to delay a read command and output the delayed read command, and an output enable signal output unit configured to shift the delayed read command in synchronization with a DLL clock signal and output an output enable signal, according to control of CL and the count value.

16 Claims, 3 Drawing Sheets

OUTPUT ENABLE SIGNAL GENERATION CIRCUIT

CROSS-REFERENCES TO RELATED APPLICATION

The present application claims priority under 35 U.S.C. §119(a) to Korean application number 10-2012-0061566, filed on Jun. 8, 2012, in the Korean Intellectual Property Office, which is incorporated herein by reference in its entirety.

BACKGROUND

1. Technical Field

The present invention generally relates to semiconductor design technology, and more particularly, to an output enable (OE) signal generation circuit of a semiconductor memory device.

2. Related Art

A semiconductor memory device internally uses an internal clock signal to output data. However, a semiconductor memory device requires an external clock signal to output data to the outside during a read operation. Therefore, during the read operation, the semiconductor memory device must perform an operation that synchronizes a read command, an external clock signal, and an internal clock signal. For this occur, there will be an instance where the clock signal synchronized with the read command transitions from the external clock signal to the internal clock signal, which is commonly referred to as "domain crossing."

The semiconductor memory device includes various circuits to perform the domain crossing operation, such as an output enable (hereinafter, "OE") signal generation circuit. The OE signal generation circuit synchronizes a read command, which is transmitted in synchronization with an external clock signal, with an internal clock signal and outputs the synchronized signal as an OE signal. The OE signal subjected to the domain crossing operation includes CAS latency (CL) information, which allows the semiconductor memory device to output data in synchronization with an external clock signal at a desired time after the read command.

The CL information may be measured from when a read command is applied to when data is to be outputted, using one cycle of an external clock signal as the unit time, and is generally stored in a mode register set (MRS) provided inside a semiconductor device.

Skew may occur between the external clock signal and the internal clock signal, due to delay elements inside the semiconductor memory device. The semiconductor memory device includes an internal clock signal generation circuit to compensate for the skew. It representatively includes a phase locked loop (PLL) and a delay locked loop (DLL). In embodiments of the present invention, a DLL clock signal generated by the DLL is used as an internal clock signal.

FIG. 1 illustrates a conventional DLL circuit 200.

Referring to FIG. 1, a DLL locking signal DLL_LOC will be described as follows.

The DLL circuit 200 includes a DLL delay line 210, a DLL replica model unit 230, and a phase detection unit 220.

The DLL delay line 210 is configured to delay an external clock signal EXTCLK by a predetermined time and outputs a DLL clock signal DLLCLK. The DLL replica model unit 230 models a delay until the DLL clock signal DLLCLK is outputted to the outside of the semiconductor memory device, and is configured to further delay the DLL clock signal DLLCLK by a predetermined time and output a feedback clock signal FBCLK. The feedback clock signal FBCLK includes information on the delay of the DLL delay line 210 and the delay until the DLL clock signal DLLCLK is outputted to the outside of the semiconductor memory device.

The phase detection unit 220 is configured to compare the phases of the external clock signal EXTCLK with the feedback clock signal FBCLK, and enable the DLL locking signal DLL_LOC when the phases coincide with each other. When the DLL locking signal DLL_LOC is enabled, the DLL delay line applies a delay on the external clock signal EXTCLK. When a DLL reset signal DLLRST is enabled, the phase detection unit 220 disables the DLL locking signal DLL_LOC such that the DLL circuit 200 resets the delay on the DLL delay line 210.

When the DLL locking signal DLL_LOC is enabled, the DLL circuit 200 delays the external clock signal EXTCLK by the fixed delay and outputs the DLL clock signal DLLCLK, before an operation of the DLL circuit 200 is reset. When the DLL reset signal DLLRST is enabled in a DLL reset mode, the DLL locking signal DLL_LOC is disabled to reset the delay on the DLL delay line 210.

FIG. 2 is a block diagram of a conventional OE signal generation circuit 1.

Referring to FIG. 2, the OE signal generation circuit 1 includes an OE reset signal generation unit 10, a first delay unit 20, a second delay unit 30, a counter unit 40, and an OE signal output unit 50. The first delay unit 20 includes a delay line 21 and a replica model section 22.

The OE reset signal generation unit 10 is configured to enable an OE reset signal OERST in response to a reset signal RST or DLL locking signal DLL_LOC. The reset signal RST is enabled in response to a setting operation of an MRS of the semiconductor memory device.

In order to compensate for delay caused by delay elements inside a semiconductor memory device, a DLL circuit generates a DLL clock signal DLLCLK having a phase which leads that of an external clock signal by a predetermined time such that the clock signal is precisely synchronized with data. The DLL circuit works with the semiconductor memory device and adjusts the delay for the clock signal. Depending on the state of the semiconductor memory device, the operation thereof may need to be reset to recover the initial delay time. For this reset operation, the DLL reset mode applies a predetermined delay to a clock signal inputted to the delay line of the DLL circuit.

The DLL locking signal DLL_LOC fixes a delay value inside the DLL circuit when the DLL clock signal DLLCLK has a phase which leads the phase of the external clock signal EXTCLK by the predetermined time, and is disabled when the DLL reset mode is enabled. When the DLL locking signal DLL_LOC is disabled, the OE reset signal generation unit 10 enables an OE reset signal OERST.

The delay line 21 of the first delay unit 20 models a delay line which delays the external clock signal by a predetermined time in the DLL circuit, and is configured to delay the OE reset signal OERST by a predetermined time and outputs a first delayed OE reset signal D1.

The replica model section 22 of the first delay unit 20 models a delay inside the semiconductor memory device until a signal outputted from the DLL circuit is outputted to the outside of the semiconductor device. The replica model section 22 is configured to delay the first delayed OE reset signal D1 by a predetermined time and output a second delayed OE reset signal D2.

The second delay unit 30 models the delay line which delays an external clock signal by a predetermined time in the DLL circuit, and is configured to delay a read command RD by a predetermined time and output the delayed read command DRD. The second delay unit 30 delays the read command RD by the same delay as that of the delay line 21 of the first delay unit 20.

The counter unit 40 is configured to count the external clock signal EXTCLK and output a count value N, in response to the OE reset signal OERST and the second delayed OE reset signal D2. The count value N represents a signal delay caused by the first delay unit 20.

The OE signal output unit 50 is configured to shift the delayed read command DRD by the CL-count value N (CL-N) in synchronization with the DLL clock signal DLLCLK, and output an OE signal OE.

Therefore, the OE signal OE is enabled by the delay of the replica model section 22 before the CL. The semiconductor memory device uses the OE signal OE to output data in synchronization with the external clock signal at a desired time after the read command.

The OE signal generation circuit 1 enables the DLL reset mode and the OE reset signal OERST to set the count value N, according to the reset signal RST set in the MRS.

Therefore, the OE signal generation circuit 1 may not secure an accurate count value N when the frequency of the external clock signal EXTCLK is changed, which may lead to undesired timing consequences. The output timing of the OE signal OE may not be secured except by utilizing a reset method using the DLL reset mode or MRS.

SUMMARY

In an embodiment of the present invention, an output enable signal generation circuit includes: an output enable reset signal generation unit configured to enable an output enable reset signal in response to an external clock signal, a DLL locking signal, and a reset signal; an output enable reset signal delay unit configured to delay the output enable reset signal by a predetermined time and output the delayed output enable reset signal; a counter unit configured to output the count of the external clock signal as a value in response to the output enable reset signal and the delayed output enable reset signal; a read command delay unit configured to delay a read command by a predetermined time and output the delayed read command; and an output enable signal output unit configured to shift the delayed read command in synchronization with a DLL clock signal and output an output enable signal, according to control of CAS latency (CL) and the count value.

BRIEF DESCRIPTION OF THE DRAWINGS

Features, aspects, and embodiments are described in conjunction with the attached drawings, in which.

DETAILED DESCRIPTION

Hereinafter, an output enable signal generation circuit will be described below with reference to the accompanying drawings through an embodiment of the present invention.

Figure 1:
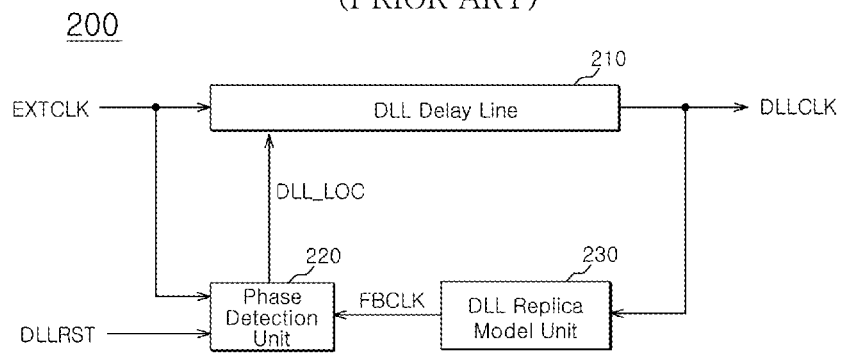
FIG. 1 illustrates a conventional DLL circuit.
Figure 2:
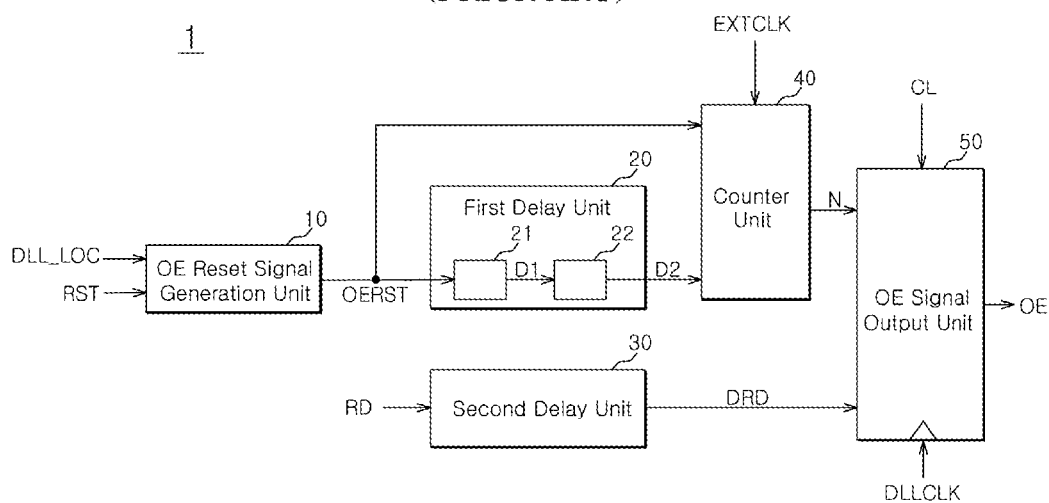
FIG. 2 is a block diagram of a conventional output enable (OE) signal generation circuit.
Figure 3:
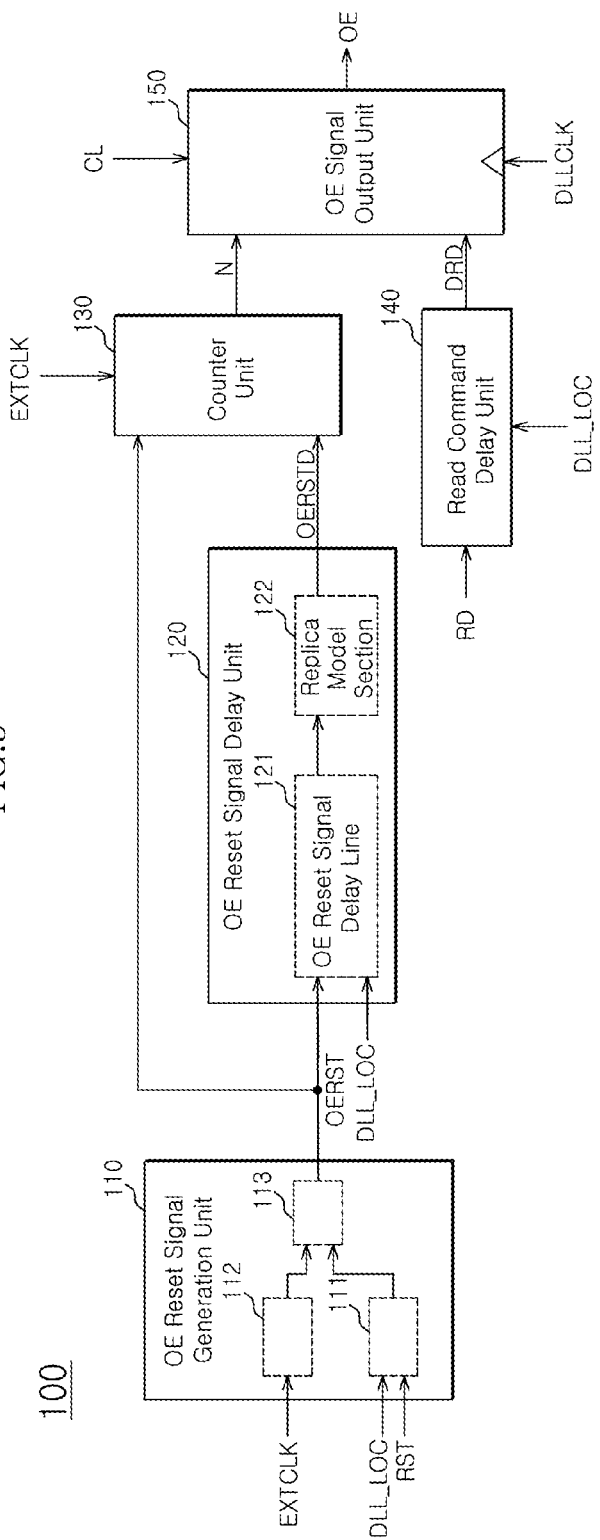
FIG. 3 is a block diagram of an OE signal generation circuit according to an embodiment of the present invention.

FIG. 3 is a block diagram of an OE signal generation circuit 100 according to an embodiment of the present invention.

Referring to FIG. 3, the configuration and operation of the OE signal generation circuit 100 according to an the embodiment will be described as follows.

The OE signal generation circuit 100 includes an OE reset signal generation unit 110, an OE reset signal delay unit 120, a counter unit 130, a read command delay unit 140, and an OE signal output unit 150.

The OE reset signal generation unit 110 includes a first OE reset signal output section 111, a second OE reset signal output section 112, and a signal combination section 113.

The OE reset signal generation unit 110 is configured to enable an OE reset signal OERST when a reset signal RST is enabled or a DLL locking signal DLL_LOC is disabled in response to a frequency change of an external clock signal EXTCLK or a setting operation of an MRS.

The OE reset signal delay unit 120 includes an OE reset signal delay line 121 and a replica model section 122.

The OE reset signal delay unit 120 is configured to delay the OE reset signal OERST by a predetermined time and output the delayed OE reset signal OERSTD. The OE reset signal delay unit 120 delays the OE reset signal OERST by a similar delay as those of a DLL delay line 210 and a DLL replica model unit 230 in a DLL circuit 200.

The OE reset signal delay line 121 is configured to fix a delay when the DLL locking signal DLL_LOC is activated, similar to the DLL delay line 210. Accordingly, the signal delay of the OE reset signal delay line 121 is similar to the signal delay of the DLL delay line 210. In addition, the signal delay of the replica model section 122 is similar to the signal delay of the DLL replica model unit 230.

The OE reset signal delay line 121 is configured to fix a delay in response to the DLL locking signal DLL_LOC onto the OE reset signal OERST. The replica model section 122 is configured to delay an output signal of the OE reset signal delay line 121 by a predetermined time and output a delayed OE reset signal OERSTD.

The OE reset signal delay unit 120 delays the enabled OE reset signal OERST by a predetermined time corresponding to the signal delay of the OE reset signal delay line 121 and the replica model section 122, and outputs the delayed OE reset signal OERSTD.

The counter unit 130 is configured to count the external clock signal EXTCLK and output the count value N, in response to the OE reset signal OERST and the delayed OE reset signal OERSTD.

The counter unit 130 starts to count the external clock signal EXTCLK when the enabled OE reset signal OERST is inputted, and stops the counting of the external clock signal EXTCLK when the enabled delayed OE rest signal OERSTD is inputted.

The counter unit 130 counts the external clock signal EXTCLK and outputs the signal delay of the OE reset signal delay line 121 and the replica model section 122 as the count value N.

The counter unit 130 outputs the count value N that represents the delay between the enabled OE reset signal OERST and the enabled delayed OE reset signal OERSTD.

The read command delay unit 140 is configured to delay the read command RD by a predetermined time and output the delayed read command DRD. Similar to the DLL delay line 210, the read command delay unit 140 fixes a delay when the DLL locking signal DLL_LOC is enabled, and the signal delay of the read command delay unit 140 is similar to the that of the DLL delay line 210 in the DLL circuit 200.

The OE signal output unit 150 is configured to shift the delayed read command DRD by a CL-count value N and output the shifted signal as an OE signal OE, in response to the DLL clock signal DLLCLK. The OE signal output unit 150 is a general shift register which is controlled by the CL and the count value N and configured to shift the delayed read command DRD in synchronization with the DLL clock signal DLLCLK.

As described above, the CL has time information from when a read command is applied to when data is to be outputted, using one cycle of the external clock signal as the unit time.

The OE signal output unit 150 synchronizes the delayed read command DRD with the DLL clock signal DLLCLK serving as an internal clock signal, and outputs the synchronized signal as the OE signal OE. The semiconductor memory device uses the OE signal OE to output data in synchronization with the external clock signal at a desired time after the read command.

The count value N corresponds to the count of the external clock signal EXTCLK that represents the delay between the enabled OE reset signal OERST and the enabled delayed OE reset signal OERSTD. In other words, the count value N indicates the delay of the OE reset signal delay line 121 and the replica model section 122. The read command delay unit 140 delays the read command RD by a similar delay as the DLL delay line 210.

The OE signal output unit 150 is configured to shift the delayed read command DRD by the CL-count value N. As a result, the output enable signal OE is outputted by the delay of the replica model section 122 before the CL.

As described above, the replica model section 122 has a similar signal delay as the DLL replica model unit 230 modeling the delay until the DLL clock signal DLLCLK is outputted to the outside of the semiconductor memory device.

The OE signal output unit 150 outputs the output enable signal OE by the delay of the replica model section 122 before the CL, such that data may be outputted in synchronization with the external clock signal at a desired time after the read command.

Figure 4:
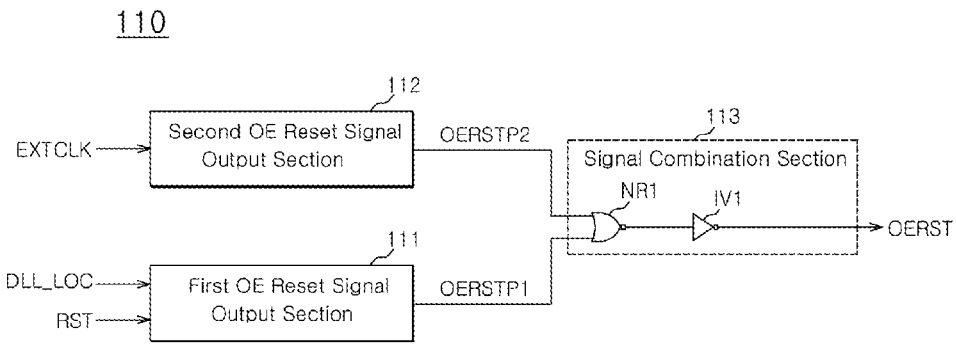
FIG. 4 is a block diagram of an OE reset signal generation unit according to an embodiment.

FIG. 4 is a block diagram of the OE reset signal generation unit 110 according to an the embodiment.

Referring to FIG. 4, the configuration and operation of the OE reset signal generation unit 110 will be described as follows.

The OE reset signal generation unit 110 includes a first OE reset signal output section 111, a second OE reset signal output section 112, and a signal combination section 113.

The first OE reset signal output section 111 is configured to output a first pre-OE reset signal OERSTP1 in response to the DLL locking signal DLL_LOC and the reset signal RST.

When the semiconductor memory device enters the DLL reset mode to disable the DLL locking signal DLL_LOC or enable the reset signal RST, the first OE reset signal output section 111 enables the first pre-OE reset signal OERSTP1.

The second OE reset signal output section 112 is configured to detect whether the frequency of the external clock signal EXTCLK has been changed, and enable a second pre-OE reset signal OERSTP2 accordingly.

The signal combination section 113 includes a first NOR gate NR1 and a first inverter IV1. The first NOR gate NR1 is configured to perform a logic operation on output signals of the first and second OE reset signal output sections 111 and 112. The first inverter IV1 is configured to invert an output signal of the first NOR gate NR1. The signal combination section 113 is configured to output the first or second pre-OE reset signal OERSTP1 or OERSTP2 as the OE reset signal OERST, when the first or second pre-OE reset signal OERSTP1 or OERSTP2 is enabled.

The second OE reset signal output section 112 may include a time to digital converter (TDC) which receives an input signal, detects a frequency change of the input signal, and provides a digital value of the detected frequency change. The digital value is calculated according to the frequency change of the external clock signal EXTCLK using the TDC, after which the second OE reset signal output section 112 outputs the second pre-OE reset signal OERSTP2.

Figure 5:
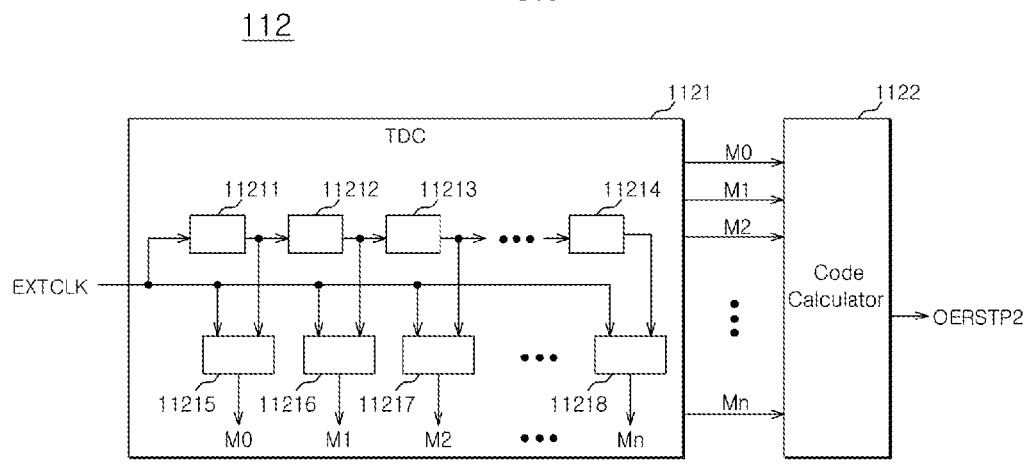
FIG. 5 is a circuit diagram of a second OE reset signal output section according to an embodiment.

FIG. 5 is a circuit diagram of the second OE reset signal output section 112 according to an the embodiment.

Referring to FIG. 5, the second OE reset signal output section 112 includes a TDC 1121 and a code calculator 1122.

The TDC 1121 is configured to receive the external clock signal EXTCLK, detect a frequency change of the external clock signal EXTCLK, and output the detected frequency change as a plurality of code values M0 to Mn. The code calculator 1122 is configured to receive the plurality of code values M0 to Mn and enable and output the second pre-OE reset signal OESRTP2 when the frequency of the external clock signal EXTCLK is changed.

Specifically, the TDC 1121 includes a plurality of delay elements 11211 to 11214 and a plurality of detecting elements 11215 to 11218. The plurality of delay elements 11211 to 11214 are configured to sequentially delay the external clock signal EXTCLK. The plurality of detecting elements 11215 to 11218 are configured to compare output signals of the respective delay elements 11211 to 11214 to the external clock signal EXTCLK and output the plurality of code values M0 to Mn.

When the frequency of the external clock signal EXTCLK is changed, the TDC 1121 reacts and outputs the plurality of code values M0 to Mn, and the code calculator 1122 detects the change and enables the second pre-OE reset signal OERSP2. The code calculator 1122 may include an encoder.

Referring to FIGS. 1 to 5, the conventional output enable signal generation circuit 1 and the OE signal generation circuit 100 according to the embodiment of the present invention will be comparatively described as follows.

The conventional output enable signal generation circuit 1 enables the OE reset signal OERST to count the external clock signal EXTCLK and sets the count value N, only when the DLL locking signal DLL_LOC and the reset signal RST are changed. However, the count value N is not changed even though the frequency of the external clock signal EXTCLK is changed. The output enable signal generation circuit 1 shifts the delayed read command DRD by the CL-count value N (CL-N) and outputs the output enable signal OE. Although the frequency of the external clock signal EXTCLK was changed, the count value N is not changed. Therefore, even when the frequency of the external clock signal EXTCLK is changed, the count value N does not reflect the signal delay of the first delay unit 20. Since the conventional output enable signal generation circuit 1 does not shift the delayed read command DRD according to the frequency change of the external clock signal EXTCLK, the output enable signal OE may lead to undesired timing consequences.

However, the OE signal generation circuit 100 according to an the embodiment of the present invention enables the OE reset signal OERST and resets the count value N, when the frequency of the external clock signal EXTCLK is changed. The reset count value N corresponds to the count of the external clock signal EXTCLK, taking into account changed frequency. In the conventional enable signal generation circuit, although the frequency of the external clock signal EXTCLK is changed, the external clock signal EXTCLK is not counted. However, the OE signal generation circuit 100 according to the embodiment of the present invention resets the count value N using the external clock signal EXTCLK that exhibits a changed frequency. Since the count value N reflects the signal delay of the OE rest signal delay unit 120, and since the OE signal generation circuit 100 according to the embodiment of the present invention shifts the delayed read command DRD using the changed count value N, the output enable signal OE is outputted with minimal undesired timing consequences.

It will be understood to those skilled in the art that the embodiment described is by way of example only. Accordingly, the output enable signal generation circuit described herein should not be limited based on the described embodiment. Rather, the output enable signal generation circuit described herein should only be limited in light of the claims that follow when taken in conjunction with the above description and accompanying drawings.

What is claimed is:

1. An output enable signal generation circuit comprising:
   an output enable reset signal generation unit configured to enable an output enable reset signal when a frequency change of an external clock is detected or a DLL locking signal is disabled;
   an output enable reset signal delay unit configured to delay the output enable reset signal by a predetermined time and output the delayed output enable reset signal;
   a counter unit configured to output the count of the external clock signal as a value in response to the output enable reset signal and the delayed output enable reset signal;
   a read command delay unit configured to delay a read command by a predetermined time and output the delayed read command; and
   an output enable signal output unit configured to shift the delayed read command in synchronization with a DLL clock signal and output an output enable signal, according to control of CAS latency (CL) and the count value.

2. The output enable signal generation circuit according to claim 1, wherein the output enable reset signal generation unit comprises:
   a first output enable reset signal output section configured to output a first pre-output enable reset signal in response to the DLL locking signal;
   a second output enable reset signal output section configured to detect a frequency change of the external clock signal and output a second pre-output enable reset signal; and
   a signal combination section configured to output the output enable reset signal in response to the first and second pre-output enable reset signals.

3. The output enable signal generation circuit according to claim 2, wherein the first output enable reset signal output section is further configured to enable the output reset signal in response to a reset signal.

4. The output enable signal generation circuit according to claim 3, wherein the second output enable reset signal output section comprises:
   a time to digital converter configured to detect the frequency change of the external clock signal and output the detected frequency change as a plurality of code values; and
   a code calculator configured to perform a logic operation on the plurality of code values and output the second pre-output enable reset signal.

5. The output enable signal generation circuit according to claim 3, wherein the first output enable reset signal output section enables the first pre-output enable reset signal when the DLL locking signal is disabled or the reset signal is enabled.

6. The output enable signal generation circuit according to claim 3, wherein the second output enable reset signal output section enables the second pre-output enable reset signal when the frequency change of the external clock signal is detected.

7. The output enable signal generation circuit according to claim 4, wherein the signal combination section enables the output enable reset signal when the first or second pre-output enable reset signal is enabled.

8. The output enable signal generation circuit according to claim 4, wherein the TDC comprises:
   a plurality of delay elements configured to sequentially delay the external clock signal; and
   a plurality of detecting elements configured to compare output signals of the respective delay elements to the external clock signal and output the plurality of code values.

9. The output enable signal generation circuit according to claim 4, wherein the code calculator comprises an encoder configured to perform a logic operation on the plurality of code values and output the second pre-output enable reset signal.

10. The output enable signal generation circuit according to claim 1, wherein the output enable reset signal delay unit has a larger signal delay than that of the read command delay unit.

11. The output enable signal generation circuit according to claim 9, wherein the output enable reset signal delay unit comprises:
    an output enable reset signal delay line configured to be controlled by the DLL locking signal and delay the output enable reset signal by a similar delay as that of a DLL delay line included in a DLL circuit; and
    a replica model section configured to delay an output signal of the output enable reset signal delay line by a similar delay as that of a DLL replica model included in the DLL circuit, and output the delayed output enable reset signal.

12. The output enable signal generation circuit according to claim 1, wherein the read command delay unit is controlled by the DLL locking signal, delays the read command by a similar delay as that of a DLL delay line included in a DLL circuit, and outputs the delayed read command.

13. The output enable signal generation circuit according to claim 1, wherein the counter unit starts to count the external clock signal when the output enable reset signal is enabled, and stops counting the external clock signal when the delayed output enable reset signal is enabled.

14. The output enable signal generation circuit according to claim 11, wherein the output enable signal output unit shifts the delayed read command in synchronization with the DLL clock signal such that the shifted signal leads by a delay of the replica model from the CL, and outputs the shifted signal as the output signal.

15. The output enable signal generation circuit according to claim 1, wherein the DLL locking signal is enabled when the phases of the external clock signal and the DLL clock signal coincide with each other in a DLL circuit, and is disabled when the DLL circuit is reset.

16. The output enable signal generation circuit according to claim 3, wherein the reset signal comprises a signal enabled by a setting operation of a mode register set (MRS).

* * * * *